United States Patent [19]
Matsubara et al.

[11] Patent Number: 5,953,286
[45] Date of Patent: Sep. 14, 1999

[54] SYNCHRONOUS DRAM HAVING A HIGH DATA TRANSFER RATE

[75] Inventors: Yasushi Matsubara; Hiroshi Ishioka, both of Tokyo, Japan

[73] Assignee: NEC Corporation, Tokyo, Japan

[21] Appl. No.: 09/139,571

[22] Filed: Aug. 25, 1998

[30] Foreign Application Priority Data

Aug. 25, 1997 [JP] Japan ..................................... 9-228629

[51] Int. Cl.⁶ .................................................. G11C 8/00
[52] U.S. Cl. ............... 365/233; 365/189.05; 365/189.09; 365/230.03
[58] Field of Search ............................... 365/233, 189.09, 365/230.05, 230.03, 189.05, 189.07

[56] References Cited

U.S. PATENT DOCUMENTS

| | | | |
|---|---|---|---|
| 5,384,738 | 1/1995 | Miyaoka et al. | 365/189.08 |
| 5,646,904 | 7/1997 | Ohno et al. | 365/233 |
| 5,815,462 | 9/1998 | Konishi et al. | 365/233 |
| 5,844,859 | 12/1998 | Iwamoto et al. | 365/233 |
| 5,881,016 | 3/1999 | Kenkare et al. | 365/230.03 |

FOREIGN PATENT DOCUMENTS 3-222192  10/1991  Japan .

*Primary Examiner*—David Nelms
*Assistant Examiner*—Hien Nguyen
*Attorney, Agent, or Firm*—McGinn & Gibb, P.C.

[57] ABSTRACT

In a semiconductor memory including a plurality of synchronous DRAMs controlled by one common memory controller, each of the synchronous DRAMs has first and second terminals for receiving a reference clock supplied from the memory controller. A signal line for this reference clock is laid out in such a manner that the signal line is connected from the memory controller firstly to the first terminal of the most remote synchronous DRAM, and then, to respective first terminals of the remaining synchronous DRAMs, in order, towards the nearest synchronous DRAM and further, to the second terminal of the nearest synchronous DRAM, and then, to respective second terminals of the remaining synchronous DRAMs, in order, towards the most remote synchronous DRAM. Thus, on the basis of the difference in phase between the same reference clock applied to the first and second terminals, each of synchronous DRAMs can obtain a delay information of the same synchronous DRAM attributable to the location of the same synchronous DRAM from the memory controller, and therefore, can set an optimum read-out data outputting timing, so that the setup time and the hold time for the read-out data supplied from all the synchronous DRAMs can be ensured. Thus, the reading operation can be speeded up by elevating the clock frequency.

6 Claims, 11 Drawing Sheets

SYNCHRONOUS DRAM HAVING A HIGH DATA TRANSFER RATE

BACKGROUND OF THE INVENTION

1. Field of the Invention

The present invention relates to a semiconductor memory including a plurality of memory devices and one control circuit which are connected through signal bus lines and a data bus lines. More specifically, the present invention relates a semiconductor memory including a plurality of memory devices, called a synchronous DRAM, having a high data transfer rate.

2. Description of Related Art

Recently, the semiconductor memory is constituted as a synchronous DRAM. This synchronous DRAM is so configured that a reading and a writing are executed in synchronism with a clock signal supplied from an external. Therefore, since a command signal and a reading address can be inputted in advance, a continuous data can be read out at a high speed.

A general synchronous DRAM system includes a plurality of synchronous DRAMs (M#1 to M#n) parallel-connected to a memory controller (MC), so that an operation of the memory is controlled by control signals. The control signals include a clock signal CLK, a RAS (row address strobe) signal RASB, a CAS (column address strobe) signal (CASB), a write enable signal (WEB). Here, the RAS signal, the CAS signal and the write enable signal are called "command signals", and various commands are formed by combinations of a high level (1) and a low level (0) of respective signals.

The commands includes a read command for reading data from the synchronous DRAMs M#1 to M#n, and a write command for writing data into the synchronous DRAMs M#1 to M#n. The read command is designated with a combination of RASB=1, CASB=0 and WEB=1, and the write command is designated with a combination of RASB=1, CASB=0 and WEB=0. In addition, these commands are timing-controlled by the clock signal CLK, and the conditions of the RAS signal RASB, the CAS signal CASB and the write enable signal WEB are recognized at the time the clock signal CLK changes from "0" to "1".

As well known, the clock signal CLK is a signal of cyclically and alternately repeating "0" and "1". In order to determine the command at what time should be executed by the synchronous DRAM, and in order to specify which of the synchronous DRAMs M#1 to M#n is given with the command, chip select signals CS#1 to CS#n are supplied to the synchronous DRAMs M#1 to M#n, respectively. The chip select signal supplied to only the synchronous DRAM to which the command should be given, is brought to "1" at the timing the command should be applied. Furthermore, an address bus (ADD.BUS) for designating an address of a memory cell in each synchronous DRAM and a data bus (DATA.BUS) for transferring data between the memory controller and the synchronous DRAMs M#1 to M#n.

Referring to FIG. 8, there is shown a block diagram for illustrating a signal connection between the memory controller and the synchronous DRAMs in the prior art, but for simplification of the drawing, only one synchronous DRAM M#i representative of the synchronous DRAMs M#1 to M#n is shown, and the chip selection signal is omitted.

The clock signal CLK, the command signals RASB, CASB and WEB and the address bus ADD.BUS are unidirectional signals from the memory controller MC to the synchronous DRAM M#i, and therefore, the memory controller MC includes drivers for respective signals (CLOCK DRIVER 1, COMMAND DRIVER 1, COMMAND DRIVER 2, COMMAND DRIVER 3, ADDRESS DRIVER 1 to ADDRESS DRIVER M), and the synchronous DRAM M#i includes receivers for receiving the respective signals (CLOCK RECEIVER 1, COMMAND RECEIVER 1, COMMAND RECEIVER 2, COMMAND RECEIVER 3, ADDRESS RECEIVER 1 to ADDRESS RECEIVER M). However, since the data bus transfers a bidirectional signal between the memory controller MC and the synchronous DRAM M#i, each of the memory controller MC and the synchronous DRAM M#i includes drivers and receivers (DATA DRIVER 1 to DATA DRIVER n and DATA DRIVER 1 to DATA DRIVER n).

The clock receiver generates an internal clock ICLK, which is used for latching the command, the address and the data and for outputting the data. For this purpose, the receivers are respectively connected to latches controlled by the internal clock ICLK (COMMAND LATCH 1, COMMAND LATCH 2, COMMAND LATCH 3, ADDRESS LATCH 1 to ADDRESS LATCH m, DATA LATCH 1 to DATA LATCH n), and the drivers are connected to data output circuits controlled by the internal clock ICLK (DATA OUTPUT CIRCUIT 1 to DATA OUTPUT CIRCUIT n). Here, the latch latches the signal at the time the clock signal changes from "0" to "1" and holds the same signal until a next cycle, namely, at the next time the clock signal changes from "0" to "1".

With this arrangement, after the clock signal has changed from "0" to "1", even if for example the RAS signal RASB is caused to change from "1" to "0", this change of the RAS signal RASB is not transferred to the COMMAND LATCH 1 internally provided in the synchronous DRAM M#i and its downstream side circuits. This operation can be rephrased as the command is acknowledged at each clock cycle.

Here, the write/read operation will be described with reference to FIGS. 9 and 10. FIG. 9 is a timing chart of the signals supplied to different synchronous DRAMs M#i for illustrating the write operation. "#+number" added at the end of signal names corresponds to the DRAM number.

First, the clock #0 cyclically repeats "0" and "1", The command #0 corresponds to a blanked portion, and is latched at the time the clock #0 changes "0" to "1" in the synchronous DRAM M#0. Cross-hatched portions in the command #0 and in the address #0 corresponds to a period in which the chip select signal CS#0 is "0", and the blanked portion corresponds to the period in which the chip select signal CS#0 is "1".

In the case that the chip select signal CS#0 is "0", the signals constituting the command are not received by the synchronous DRAM M#i regardless of the level (1 or 0) of each of the signals constituting the command. This is true in the address #0. The data #0 assumes, in addition to "0" and "1", a "Hi-z" condition taking an intermediate potential between the potential of "0" and the potential of "1", which corresponds to the condition in which no data to be written exists on the data bus in the write operation period and the condition in which no read-out data exists on the data bus in the read operation. The data to be written is given at the same time as the write command and the column address are given to the synchronous DRAM M#0.

A similar write operation is carried out in each of the synchronous DRAMs M#2 and M#4. In FIG. 9, Td#2 and Td#4 are a delay time required until the clock, the command signals and the address reach from the memory controller MC to the synchronous DRAMs M#2 and M#4, respectively. The delay time is considered by using the synchronous DRAMs M#0 as the reference, since the synchronous DRAMs M#2 is located physically nearest to the memory controller MC and therefore, since the delay time from the memory controller MC to the synchronous DRAMs M#0 can be considered to be substantially "0" (zero).

A cause of the delay time is a parasite resistance and a parasite capacitance of each signal line, and is substantially in proportion to the wiring distance. Accordingly, the delay time Td#4 is larger than the delay time Td#2. In particular, since the data bus has the parasite capacitance larger than that of the command signals, the address signals and the clock signal, the delay time Tdd#2 of the data is larger than the delay time Td#2 of the other signals, and similarly, the delay time Tdd#4 of the data is larger than the delay time Td#4 of the other signals. The following is the reason for why the parasite capacitance of the data bus is large: As seen from FIG. 8, each synchronous DRAM M#i includes both the receiver and the driver for only the data bus, and a number of synchronous DRAMs M#i are provided, with the result that the parasite capacitance becomes large by the parasite capacitance of the drivers.

In FIG. 9, the time defined as "Ts#i" is called a setup time. The setup time of the data bus in the synchronous DRAMs M#2 and M#4 are expressed as Tsd#2 and Tsd#4, respectively. As seen from FIG. 9, the setup time is defined by using the clock as the reference, and therefore, the clock signal, the command signals and the address signals have the same delay time. Therefore, the setup time of these signals has no location dependency. However, the delay time of the data is larger than that of the other signals, the setup time of the data to be written becomes short with increase of the wiring distance from the memory controller.

Next, the read operation will be described with reference to FIG. 10. In the read operation, the read command and the address are given similarly to the write operation. Td#2 and Td#4 indicate a delay time. The read operation is different from the write data in that the time where the data to be read is actually read out, is different from the time where the command and the address are given from the memory controller MC. In the synchronous DRAMs M#i, the times Tac#0, Tac#2, and Tac#4 are required respectively after each synchronous DRAM receives the read command and the address from the memory controller MC before the data is actually read out onto the data bus. These times are equal to one another. Therefore, for example, the data to be read in the synchronous DRAMs M#2 is read out with a delay of Td#2+Tac#2 from the clock #mc in the memory controller MC.

This delay time becomes Td#2+Tac#2 in the synchronous DRAMs M#4. Furthermore, times Tddf#2 and Tddf#4 are required, respectively, until the read-out data reaches the memory controller MC. The read-out data having reached the memory controller MC is designated with data #mcf2 and data #mcf4, respectively, in FIG. 10. Here, the setup time of the read-out data is defined in comparison with the clock #mc of the memory controller MC receiving the read-out data, differently from the setup time of the write operation which is defined in comparison with the clock #i in the respective synchronous DRAM M#i. In the example shown in FIG. 10, the setup time of the data #mcf0 corresponds to Tsdf#0, and the setup time of the data #mcf2 corresponds to Tsdf#2. However, since the delay time of the data #mcf4 is too large, the data #mcf0 becomes later than the reference timing point, with the result that no setup time can be obtained.

Here, the role of the setup time in the synchronous DRAM will be described with reference to FIGS. 11 to 13. FIG. 11 is a circuit diagram of a latch circuit of latching an input signal IN through a transfer gate TG as an output signal OUT. FIGS. 12 and 13 are timing charts of a latch signal $\phi$, the input signal IN and the output signal OUT for illustrating an operation of the latch circuit shown in FIG. 11. FIG. 12 illustrates a problem in the case that a sufficient setup time cannot be obtained, and FIG. 13 illustrates a problem in the case that a sufficient hold time cannot be obtained. Here, the hold time is defined to be a length of time in which the input signal IN is held after the latch signal $\phi$ is brought from "0" to "1" (namely, after the inverted latch signal $\phi$B is brought from "1" to "0"), and indicated by Thold in FIG. 13. The setup time is shown by Tsetup in FIG. 12.

The example shown in FIGS. 11 to 13 illustrate a situation that "1" is applied to the input IN, and is held at the output OUT when the latch signal $\phi$ is brought to "1". Here, assuming that the Tsetup is too short, the transfer gate TG is closed before the output OUT is sufficiently changed, with the result that the output OUT is not completely fixed to "1" and is returned to "0". This is the problem in the case that the setup time is too short. To the contrary, if Thold is too short, the output is changed to the level of "1" and becomes stable at the level of "1" once, however, in the course of the closing operation of the transfer gate TG, the input IN is changed from "1" to "0", with the result that the output OUT is returned to the level of "0". This is the problem in the case that the hold time is too short.

From the above short explanation, it would be understood that if both the setup time Tsetup and the hold time Thold of a necessary and sufficient value are not ensured, the signal can be properly transferred between the memory controller and the synchronous DRAMs M#i.

Recently, however, the frequency of the clock signal has increased, and therefore, the clock period correspondingly has become short, so that the maximum time of the total value of the setup time and the hold time has become substantially equal to the clock period, or equal to the clock period (not larger than 5 ns) attributable to the delay time (1 ns to 2 ns) of the signal interconnection, with the result that a sufficient setup time cannot be ensured. In addition, The problem that a sufficient hold time cannot be obtained, has been discussed actively. Because of this problem, it is not possible to elevate the clock frequency or the operation speed in a system for transferring a large amount of data for a short time. The reason for this is clearly illustrated in FIG. 10.

In the example shown in FIG. 10, the data #mcf4 read out from the synchronous DRAMs M#4 becomes out of time from the latching time of the memory controller MC, and a necessary and sufficient setup time Tsdf#2 for the data #mcf2 read out from the synchronous DRAMs M#2 cannot be obtained. In the write operation shown in FIG. 9, the setup time Tsd#4 becomes short, but is not so remarkable in comparison with the read operation shown in FIG. 10. The reason for this is as follows: In the write operation, all the command, the address and the data to be written are transmitted in the same direction from the memory controller MC to the synchronous DRAM M#i, but in the read operation, the transmission direction of the command and the address is opposite to the transmission direction of the read-out data, with the result that the delay time becomes larger than that in the write operation, dependently upon the location of the synchronous DRAM. Accordingly, it is important to improve the setup time in the read operation.

Here, assume that in order to improve the setup time in the read operation, the synchronous DRAM M#i is so modified to shorten the reading delay time Tsc#i and to elongate Tsdf#i in FIG. 10. In this case, to the contrary, the hold time of the data read out from the synchronous DRAM M#i located near to the memory controller MC, for example, the hold time Thdf#0 of the data #mcf0, becomes too short, so that the above mentioned problem occurs. Namely, if the data reading-out time is shifted in advance similarly in all the synchronous DRAMs M#i, the setup time Tsdf#2 of the data #mcf2 from the synchronous DRAM M#2 located at a remote side from the memory controller, is improved. However, if the data reading-out time was shifted in advance to cause the data #mcf4 to have a sufficient setup time, the hold time Thdf#0 of the data #mcf0 cannot be obtained. Under this circumstance, it is considered that it is the best way to make the delay time of the signal interconnection as small as possible.

A specific example of this method will be now described as a second prior art. This second prior art method is disclosed in Japanese Patent Application Pre-examination Publication No. JP-A-03-222192 and U.S. Pat. No. 5,384,739 claiming the Convention Priorities based on seven Japanese patent applications including the application of JP-A-03-222192, (the content of U.S. Pat. No. 5,384,739 is incorporated by reference in its entirety into this application). This prior art example is so configured that, in a memory with a logic function, having a plurality of random access memories, a clock signal of an ECL level are supplied and distributed to each random access memory while maintaining the ECL level, and a clock distributing circuit in common to the respective random access memories is located at a center portion of a semiconductor substrate surface so as to minimize the variation in the distance from the respective random access memories to the clock distributing circuit. In addition, each random access memory is provided individually with a clock switch amplifier for generating an internal clock signal of a MOS level on the basis of a predetermined clock signal, and a write pulse generating circuit for generating, on the basis of the internal clock signal, a predetermined write enable pulse which is required for a write operation and which has an adjustable rising timing and an adjustable signal amplitude. With this arrangement, a skew between the internal clock signal and the write enable pulse and skew in the write enable pulse between the respective random access memories are minimized, so that the write operation of the memory with the logic function can be speeded up.

The above mentioned second prior art can achieve some degree of improvement. However, the second prior art is not satisfactory in the present advanced technology which has rapidly shortened the clock period, with the delay time attributable to the wiring becomes remarkable anew. Therefore, it is strongly desired to essentially overcome the above mentioned problems.

SUMMARY OF THE INVENTION

Accordingly, it is an object of the present invention to provide a semiconductor memory which has overcome the above mentioned problems of the prior art.

Another object of the present invention is to provide a semiconductor memory including a plurality of synchronous DRAMs and a memory controller provided in common to the plurality of synchronous DRAMs, capable of completely preventing an error operation attributable to a signal propagation delay and a skew, which are caused by a load of interconnections of a data bus and a clock line connected between the memory controller and the synchronous DRAMs.

The above and other objects of the present invention are achieved in accordance with the present invention by a semiconductor memory including a plurality of memory cell groups located in the form of an array and a memory controller in common to the plurality of memory cell groups, the memory controller being coupled to each of the plurality of memory cell groups through a clock line, command signal lines, an address bus and a data bus, wherein the memory controller further outputs a reference clock signal to each of the plurality of memory cell groups, wherein each of the plurality of memory cell groups has a first input terminal and a second terminal for receiving the reference clock signal, a first signal line for the reference clock signal being connected from the memory controller, first, to the first terminal of the memory cell group located at the most remote position from the memory controller, and then, respective first terminals of the remaining memory cell groups, in order, towards the memory cell group locates at the nearest position to the memory controller, and a second signal for the reference clock signal being connected from the first terminal of the memory cell group located at the nearest position to the memory controller, first, to the second terminal of the memory cell group located at the nearest position to the memory controller, and then, respective second terminals of the remaining memory cell groups, in order, towards the memory cell group located at the most remote position from the memory controller.

In a preferred embodiment, the memory controller includes a clock driver for outputting an clock signal, and each of the memory cell groups includes a clock receiver receiving the clock signal for outputting an internal clock signal, so that the operation of the memory controller and the operation of the memory cell groups are synchronized to each other.

In addition, each of the memory cell groups includes a difference detecting circuit for detecting a time difference between the reference clock applied to the first terminal and the reference clock applied to the second terminal, so that an output timing of a read-out data is adjusted on the basis of the time difference.

Specifically, the difference detecting circuit outputs the time difference by selectively activating one of a predetermined number of discrimination values.

In addition, each of the memory cell groups further includes an output control clock generating circuit receiving the internal clock signal and the discrimination values for outputting an output clock which has the same frequency as that of the internal clock, so that the read-out data is outputted from the memory cell group in accordance with the output clock.

Preferably, the output control clock outputs the output clock which has the phase adjusted in comparison with the phase of the clock signal outputted from the clock driver of the memory controller, in accordance with the activated discrimination value of the discrimination values, so that the read-out data is outputted from the memory cell group in accordance with the output clock.

The above and other objects, features and advantages of the present invention will be apparent from the following description of referred embodiments of the invention with reference to the accompanying drawings.

DESCRIPTION OF THE PREFERRED EMBODIMENT

Now, an embodiment of the semiconductor memory in accordance with the present invention will be described with reference to the accompanying drawings. Referring to FIGS. 1 to 7, there is shown the embodiment of the semiconductor memory in accordance with the present invention.
Whole Structure The whole structure of the synchronous DRAM system in accordance with the present invention will be described with reference to FIGS. 1 and 2. As shown in FIG. 2, the shown embodiment includes a memory controller MC, and a plurality of synchronous DRAMs M#i ("i"=0 to n, where "n" is a natural number not less than 1) parallel-connected to the memory controller MC, so that a read/write operation of the synchronous DRAMs M#i is controlled by the memory controller MC. This shown embodiment is so configured that, in a read operation of the synchronous DRAMs M#i, there are given a setup time and a hold time for making it possible for the memory controller MC to surely latch the read-out data outputted from all the synchronous DRAMs M#i connected to the memory controller MC, so that the signal propagate delay and the skew caused by the load of the interconnection are effectively compensated.

Figure 1:
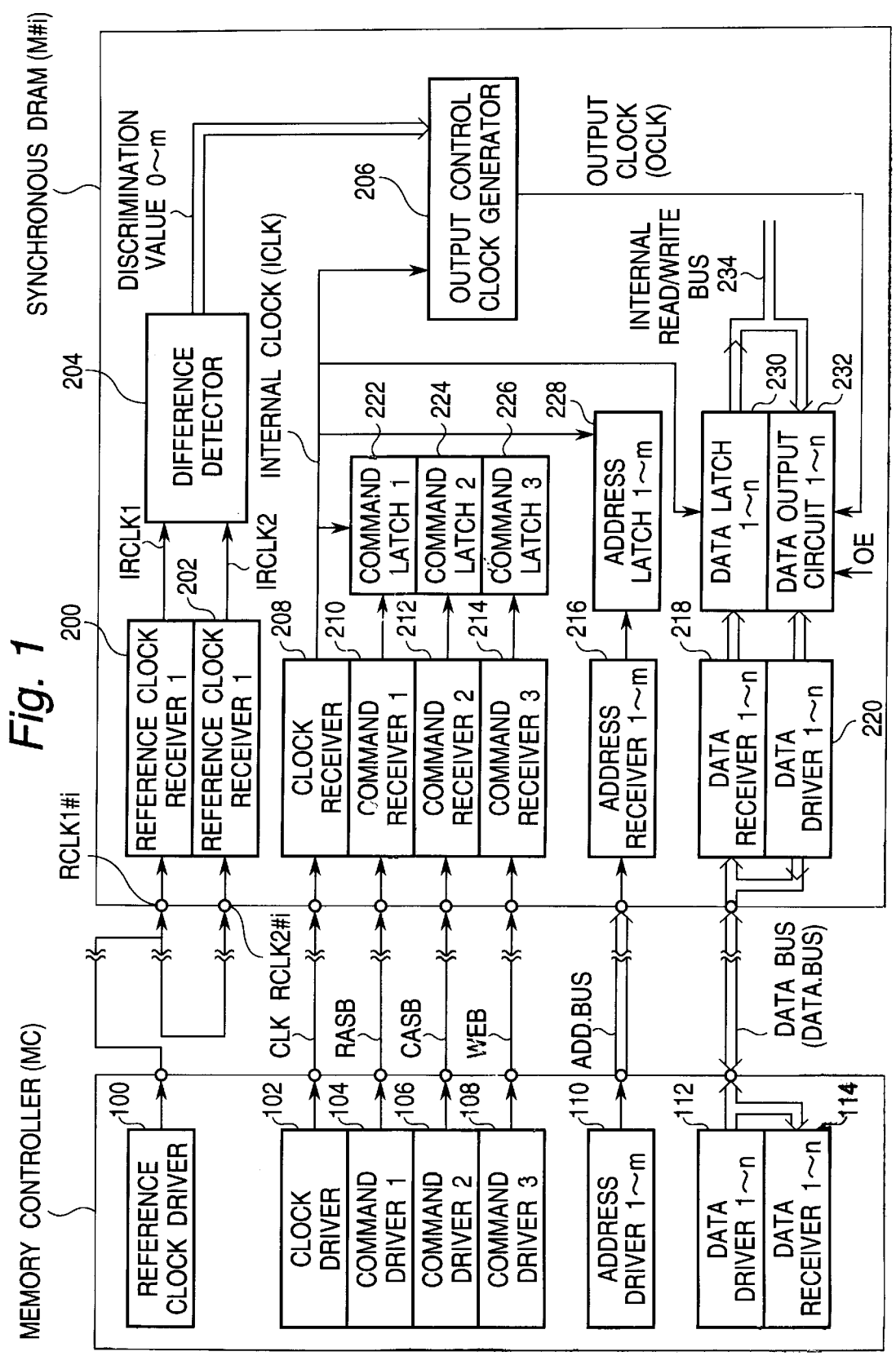
FIG. 1 is a block diagram for illustrating a signal connection between the memory controller and one synchronous DRAM in one embodiment of the synchronous DRAM system in accordance with the present invention.
Figure 2:
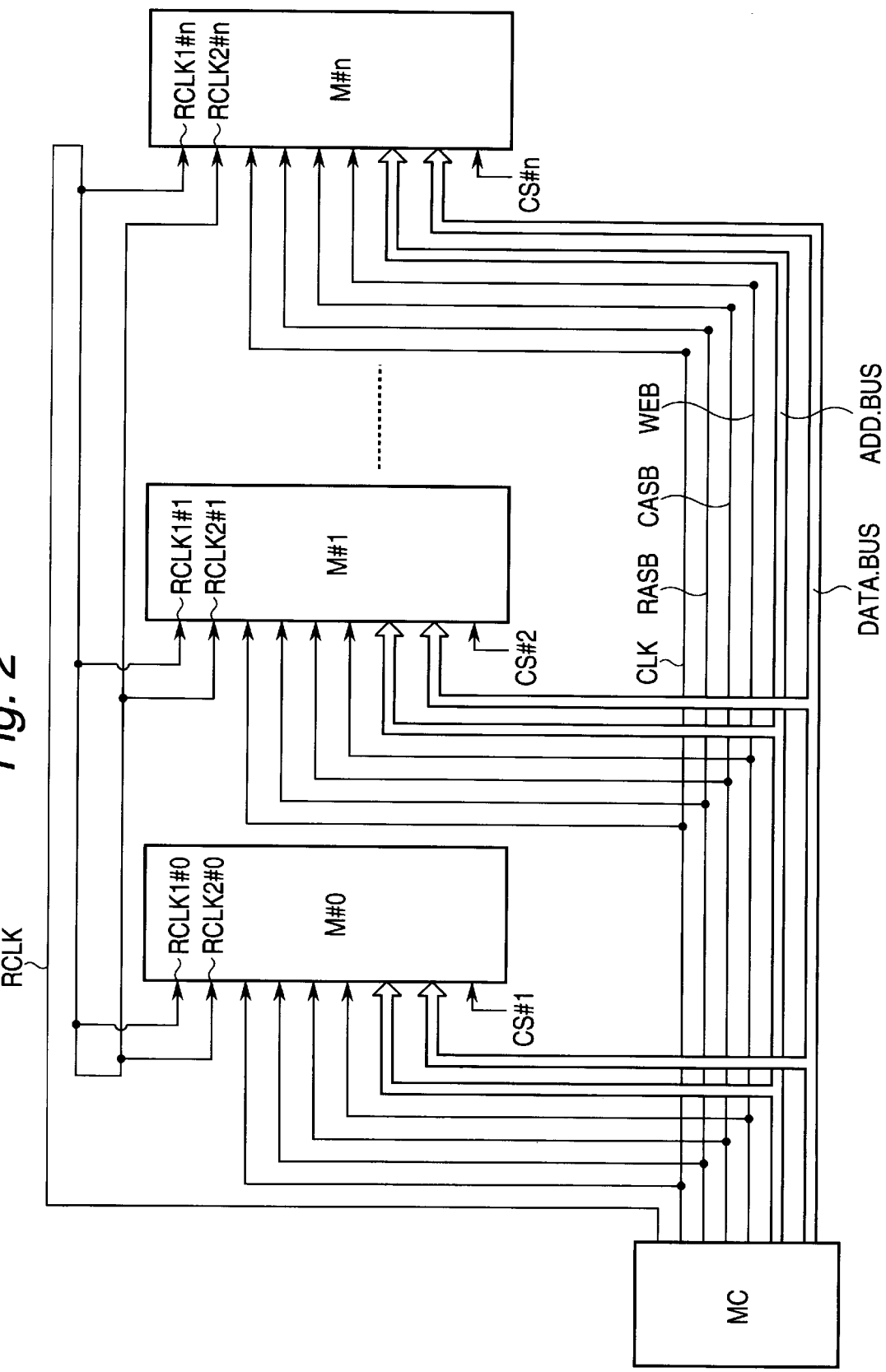
FIG. 2 is a block diagram of the whole structure of the synchronous DRAM system in accordance with the present invention including a plurality of synchronous DRAMs parallel-connected to a memory controller.
Figure 8:
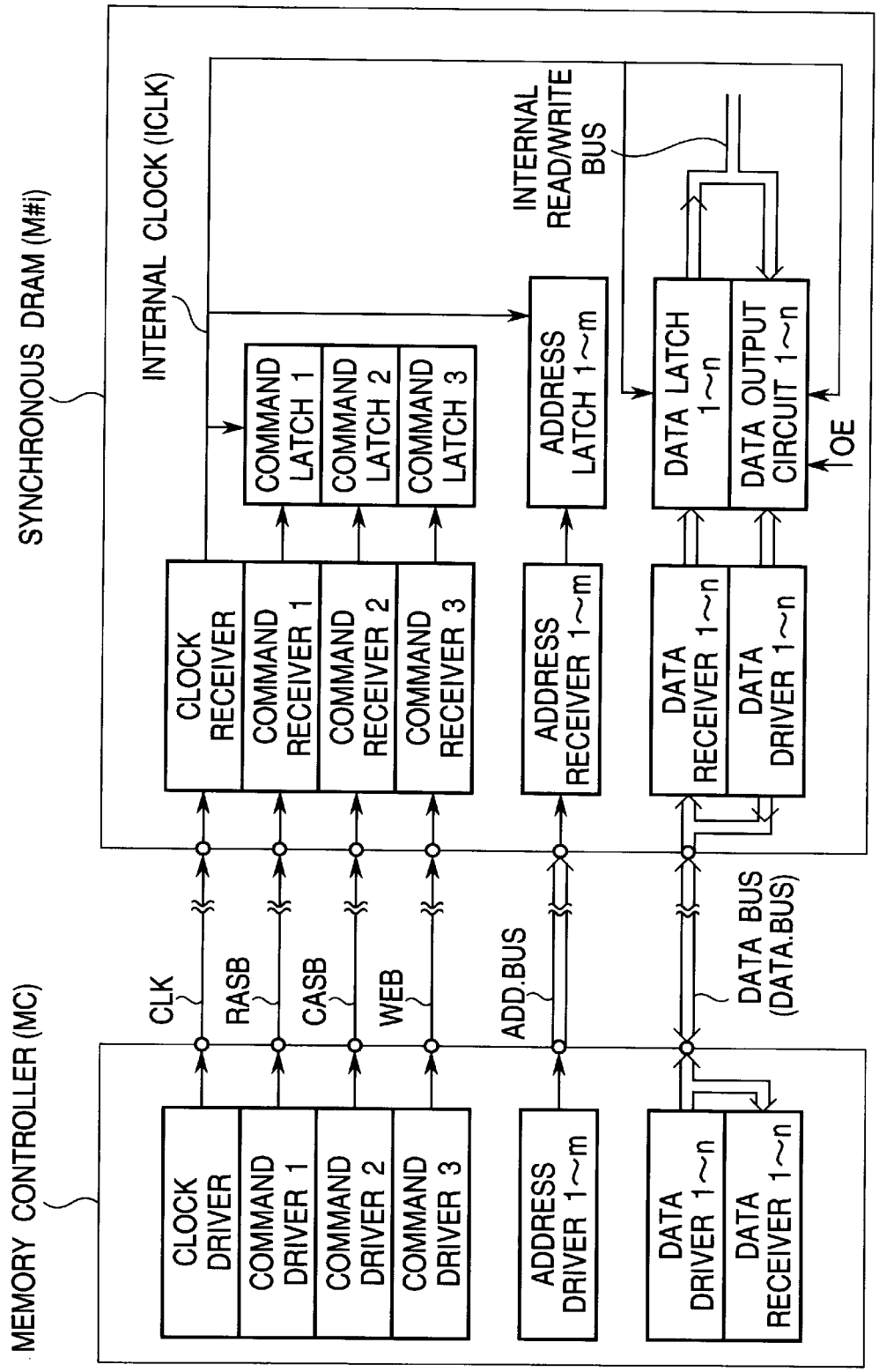
FIG. 8 is a block diagram for illustrating a signal connection between the memory controller and one synchronous DRAM in the prior art synchronous DRAM system.
Figure 9:
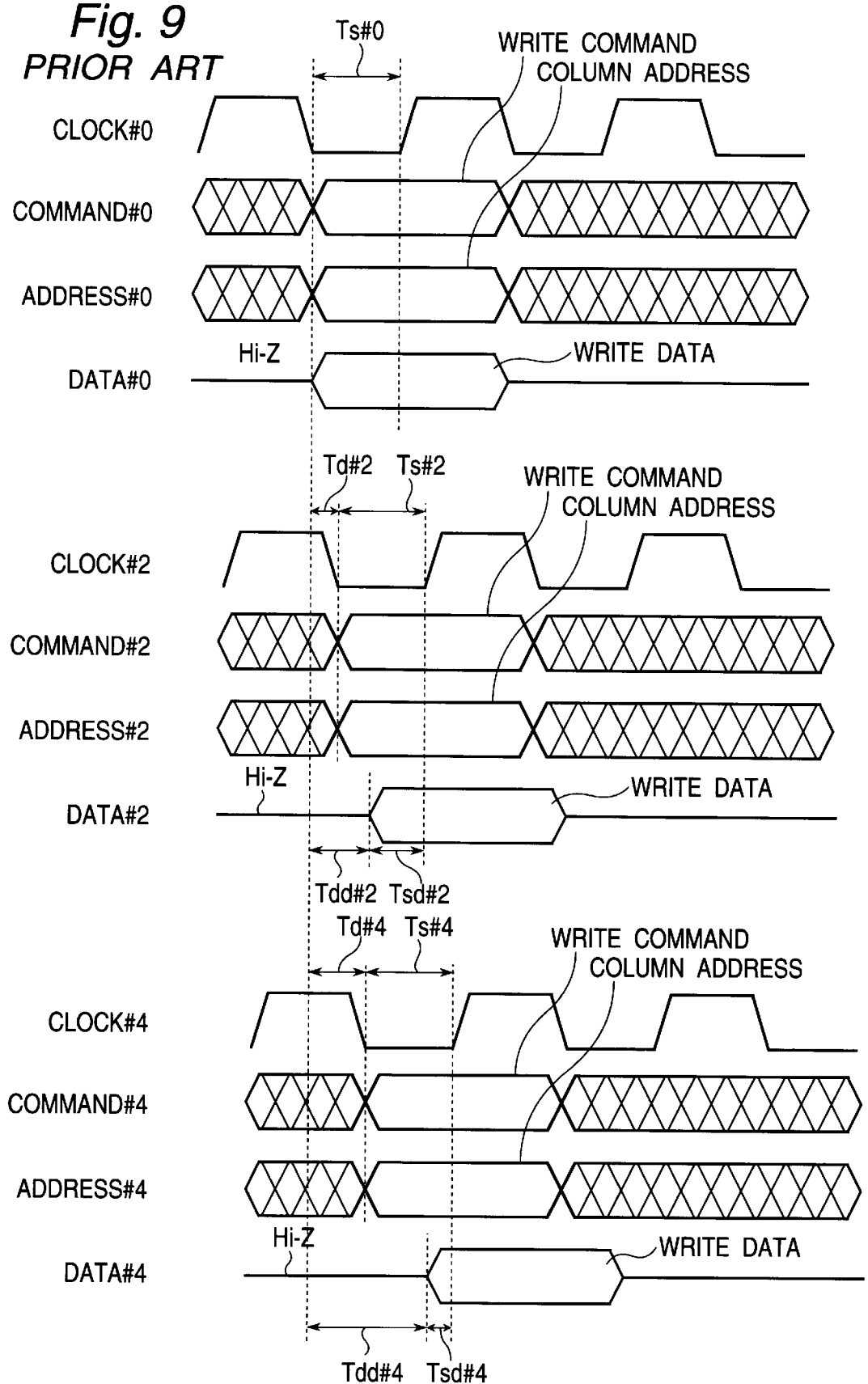
FIG. 9 is a timing chart of the signals supplied to different synchronous DRAMs for illustrating the write operation in the prior art synchronous DRAM system shown in FIG. 8.
Figure 10:
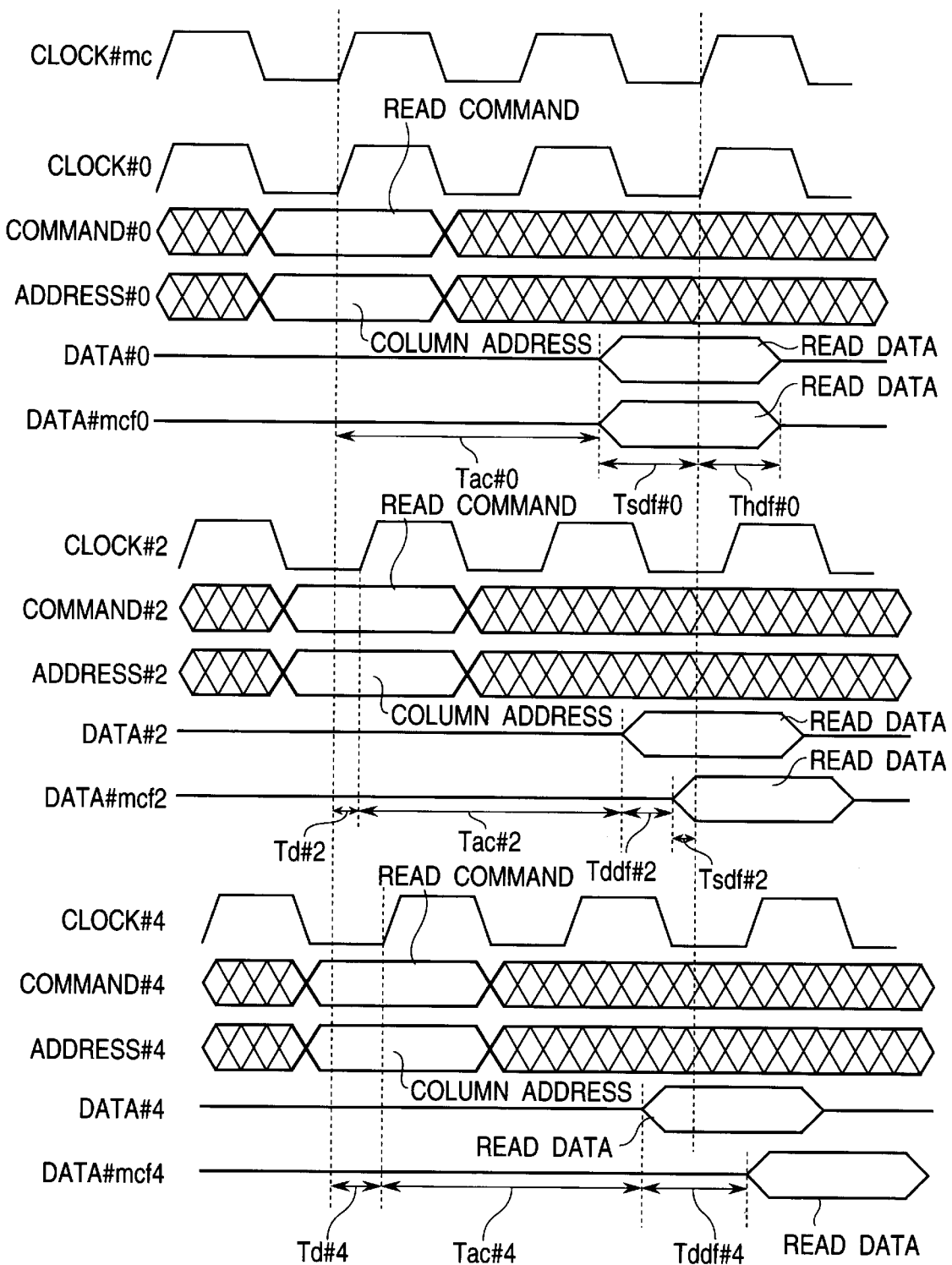
FIG. 10 is a timing chart of the signals supplied to different synchronous DRAMs for illustrating the read operation in the prior art synchronous DRAM system shown in FIG. 8.
Figure 11:
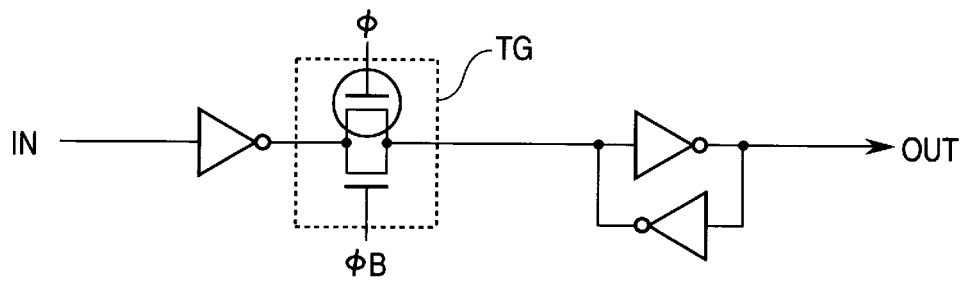
FIG. 11 is a circuit diagram of a latch circuit of latching an input signal IN through a transfer gate TG as an output signal OUT.
Figure 12:
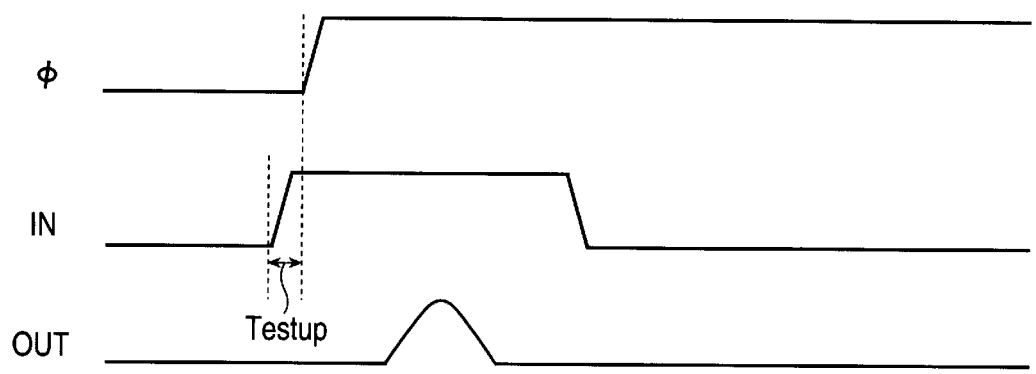
FIG. 12 is a timing chart of a latch signal φ, the input signal IN and the output signal OUT for illustrating an operation of the latch circuit shown in FIG. 11 in the case that a sufficient setup time cannot be obtained.
Figure 13:
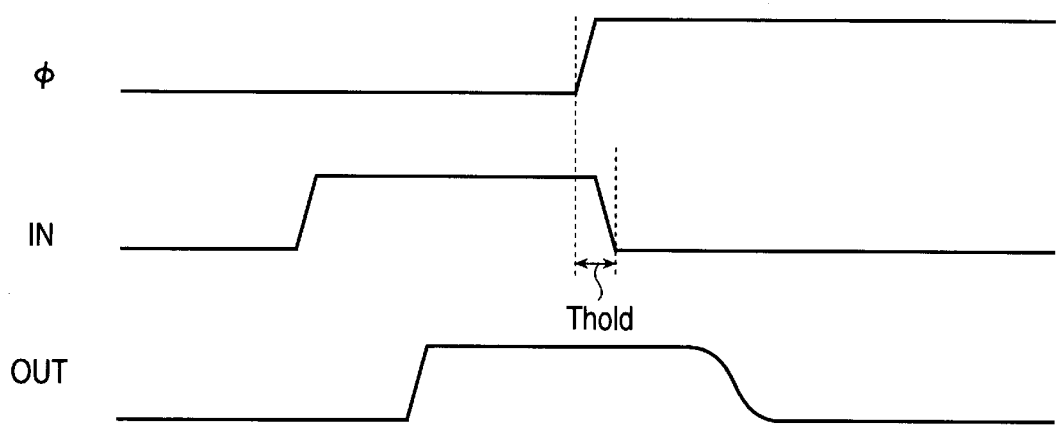
FIG. 13 is a timing chart of a latch signal φ, the input signal IN and the output signal OUT for illustrating an operation of the latch circuit shown in FIG. 11 in the case that a sufficient hold time cannot be obtained.

As seen from comparison between FIGS. 1 and 2 and FIG. 8, the memory controller MC of the shown embodiment includes a reference clock driver 100 for outputting a reference clock RCLK, in addition to the drivers and the receivers provided in the memory controller MC of the prior art memory. Namely, similarly to the memory controller MC of the prior art memory, the memory controller MC of the shown embodiment also includes a clock driver 102 for outputting a clock CLK, a command driver 104 for outputting a row address strobe signal RASB, a command driver 106 for outputting a column address strobe signal CASB, a command driver 108 for outputting a write enable signal WEB, "m" address drivers 110 for outputting an address signal of "m" bits onto an address bus ADD.BUS, "n" data drivers 112 for outputting data of "n" bits to be written onto a data bus DATA.BUS, and "n" data receivers 114 for receiving read-out data of "n" bits from the data bus DATA.BUS.

In the embodiment shown in FIG. 2, the control signals include a clock signal CLK, a RAS (row address strobe) signal RASB a CAS (column address strobe) signal (CASB), a write enable signal (WEB). Here, the RAS signal, the CAS signal and the write enable signal are called "command signals", and various commands are formed by combinations of a high level (1) and a low level (0) of respective signals.

On the other hand, each synchronous DRAM M#i of the shown embodiment includes first and second reference clock input terminals RCLK1#i and RCLK2#i for receiving the reference clock RCLK supplied from the reference clock driver 100 of the memory controller MC, in addition to input/output terminals provided in each synchronous DRAM M#i of the prior art example. The manner for connecting the reference clock RCLK to the reference clock input terminals RCLK1#i and RCLK2#i of each synchronous DRAM M#i is illustrated in FIG. 2. First, the reference clock RCLK is connected to the first reference clock input terminals RCLK1#n of the synchronous DRAM M#n located at the most remote location from the memory controller MC, and then, is connected sequentially to the first reference clock input terminals RCLK1#i of the respective synchronous DRAMs M#i in the order towards the synchronous DRAM M#0 at the nearest location to the memory controller MC, and finally, is connected to the first reference clock input terminals RCLK1#0 of the synchronous DRAMs M#0. After the reference clock RCLK is connected to the first reference clock input terminals RCLK1#0 of the synchronous DRAMs M#0, the reference clock RCLK#0 is connected to the second reference clock input terminals RCLK2#0 of the same synchronous DRAMs M#0, and then, is connected sequentially to the second reference clock input terminals RCLK2#i of the respective synchronous DRAMs M#i in the order towards the synchronous DRAM M#n at the most remote location from the memory controller MC, and finally, is connected to the second reference clock input terminals RCLK2#n of the synchronous DRAMs M#n.

Furthermore, in addition to the various receivers, latches and circuits included in each synchronous DRAM M#i of the prior art, each synchronous DRAM M#i of the shown embodiment includes a first reference clock receiver 200 having an input connected to the first reference clock input terminal RCLK#i, a second reference clock receiver 202 having an input connected to the second reference clock input terminal RCLK2#i, a difference detecting circuit 204 having a pair of inputs connected to an output of the first and second reference clock receivers 200 and 202 for outputting a signal of discrimination values "0" to "m", and an output control clock generating circuit 206 receiving the discrimination values "0" to "m" and an internal clock ICLK, for generating an output clock OCLK.

Explaining the various receivers, latches and circuits included in each synchronous DRAM M#i similarly to the prior art, each synchronous DRAM M#i of the shown embodiment includes a clock receiver 208 receiving the clock signal CLK for generating the internal clock ICLK, a command receiver 210 receiving the RAS signal RASB, a command receiver 212 receiving the CAS signal CASB, a command receiver 214 receiving the WE signal WEB, "m" address receivers 216 receiving the address signal of "m" bits onto the address bus ADD.BUS, "n" data receivers 218 receiving the data of "n" bits to be written from the data bus DATA.BUS, and "n" data drivers 220 for outputting the read-out data of "n" bits onto a data bus DATA.BUS.

Each synchronous DRAM M#i of the shown embodiment also includes a command latch 222 having an input connected to an output of the command receiver 210 and controlled by the internal clock ICLK to latch the RAS signal RASB, a command latch 224 having an input connected to an output of the command receiver 212 and controlled by the internal clock ICLK to latch the CAS signal CASB, a command latch 226 having an input connected to an output of the command receiver 214 and controlled by the internal clock ICLK to latch the WE signal WEB, "m" address latches 228 having an input connected to an output of the address receivers 216, respectively, and controlled by the internal clock ICLK for latching the address of the "m" bits, "n" data latches 230 having an input connected to an output of the data receivers 218, respectively, and controlled by the internal clock ICLK for latching the data to be written of the "m" bits, an output of the "n" data latches 230 being connected to an internal read/write bus 234, and "n" data output circuits 232 having an input connected to an internal read/write bus 234 and an output connected to an input of the data drivers 220, respectively, and controlled by an output enable signal OE and the output clock OCLK for outputting the read-out data of the "m" bits to the data drivers 220.

Operation

As seen from FIG. 2, when the memory controller outputs the reference clock RCLK, a time difference (Tdrclk#i) between the moment the reference clock RCLK is received at the first reference clock input terminal RCLK1#i and the moment the reference clock RCLK is received at the second reference clock input terminal RCLK2#i, has a correlation upon the distance between the synchronous DRAM M#i and the memory controller MC. Namely, in the synchronous DRAM M#0 located nearest to the memory controller MC, the time difference Tdrclk#0 is minimum, and in the synchronous DRAM M#n located most remote from the memory controller MC, the time difference Tdrclk#n is maximum. The difference detecting circuit 204 discriminates the magnitude of the time difference Tdrclk∩i, and outputs the discrimination values "0" to "m", which evaluates the magnitude of the time difference Tdrclk#i, with "M+1" steps.

The output control clock generating circuit 206 receives the internal clock ICLK and the discrimination values "0" to "m", and generates a clock FCLK having the same clock period (namely, frequency) as that of the internal clock ICLK. Since the internal clock ICLK has the same clock period as that of the clock CLK, the clock FCLK has the same clock period as that of the clock CLK. The output control clock generating circuit 206 can adjust the phase of the output clock OCLK arbitrarily in time. Accordingly, the output control clock generating circuit 206 can cause the output clock OCLK to have completely the same clock period and phase as those of the clock CLK, or alternatively to have a phase in advance to the phase of the clock CLK.

The output control clock generating circuit 206 is controlled by the discrimination values "0" to "m" to fix the phase of the output clock OCLK to a phase determined in accordance with an active value of the discrimination values "0" to "m". As mentioned above, since an active value of the discrimination values "0" to "m" indicates the magnitude of the time difference Tdrclk#i. The larger the time difference Tdrclk#i is, the output control clock generating circuit 206 shifts the phase of the output clock OCLK in advance. The output clock OCLK is supplied to all the "n" data output circuits 232 as a control clock.

When the synchronous DRAM M#i receives the read command, information of memory cells designated by a given address is amplified and transferred to the internal read/write bus 234. The role of the "n" data output circuits 232 is to determine when the data on the internal read/write bus 234 is outputted to an external of the synchronous DRAM M#i. The "n" data output circuits 232 do not transfer the data on the internal read/write bus 234 to the data drivers 220 until a predetermined time. The transfer timing is the moment the output clock OCLK is brought from "0" to "1" when the output enable signal OE is at "1". This output enable signal OE is a signal which is brought to "1" when a predetermined length of time has elapsed from the moment the read command is inputted. The output enable signal OE determines by which of rising edges from "0" to "1" in the periodically occurring output clock FCLK the "n" data output circuits 232 are operated.

Figure 3:
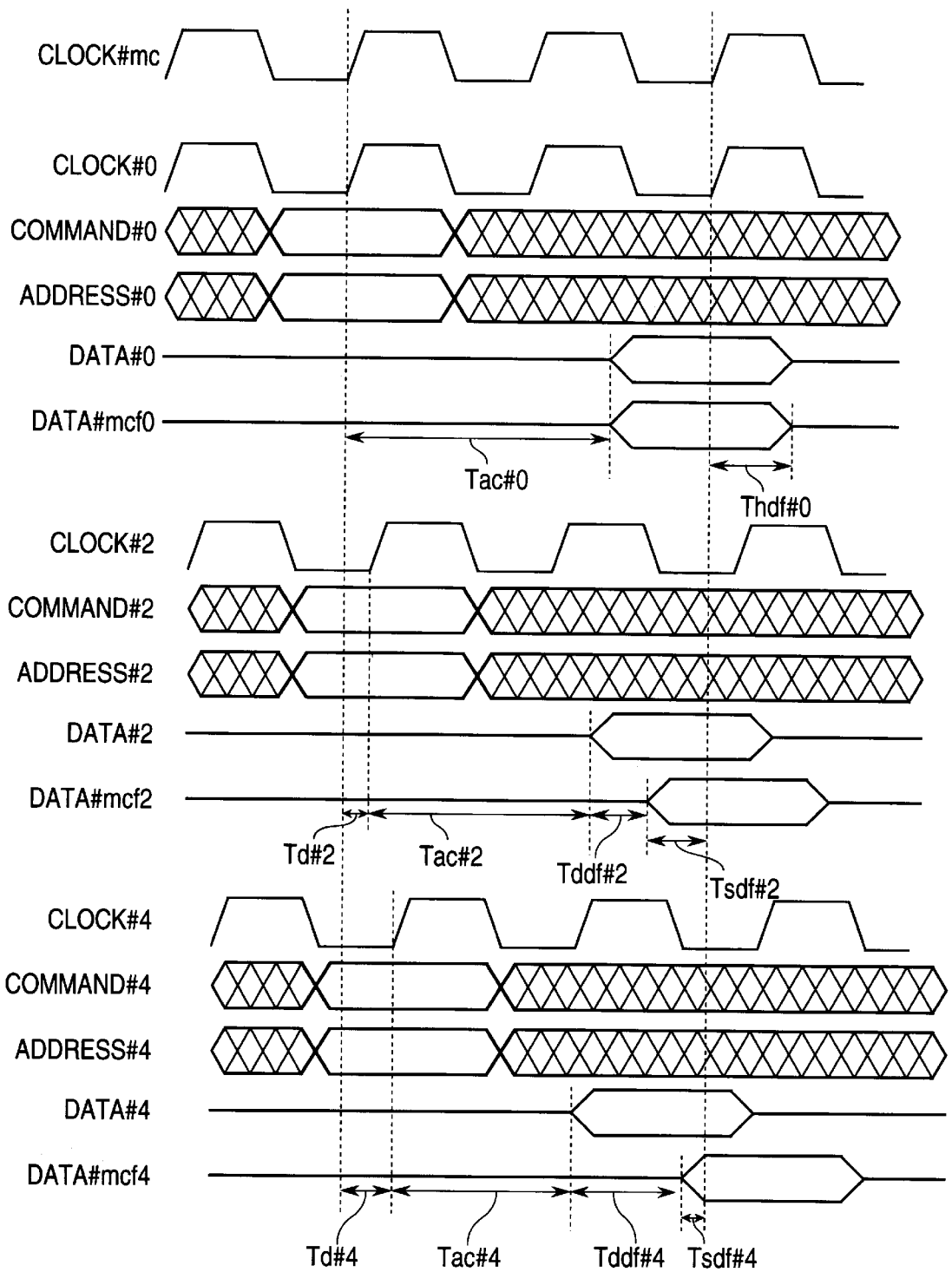
FIG. 3 is a timing chart for illustrating a read operation of the synchronous DRAM system shown in FIGS. 1 and 2.

The phase of the output clock OCLK is the latest in the synchronous DRAM M#0, and is advanced in time when the synchronous DRAM#i becomes remote from the memory controller MC, namely, when the signal interconnection becomes long. FIG. 3 is a timing chart for illustrating the read operation of the synchronous DRAM system shown in FIGS. 1 and 2. If the phase of the output clock OCLK is shifted in advance, the time Tac#i correspondingly becomes short. Therefore, the following relation holds in connection with Tac#i.

$$Tac\#0 > Tac\#1 > Tac\#2 > \ldots > Tac\#n \qquad (1)$$

The time Td#i until the command, the clock and the address reaches the respective synchronous DRAMs M#1 from the memory controller MC, and the time Tddf#i until the read-out data #i reaches the memory controller MC from the respective synchronous DRAMs M#1, are similar to those in the prior art example. Therefore, the time from the moment the read command is outputted from the memory controller MC to the moment the data #mcf4 reaches the memory controller MC from the synchronous DRAMs M#4 at the remote position from the memory controller, is expressed by (Td#4+Tac#4+Tddf#4).

Details of Construction

Figure 4:
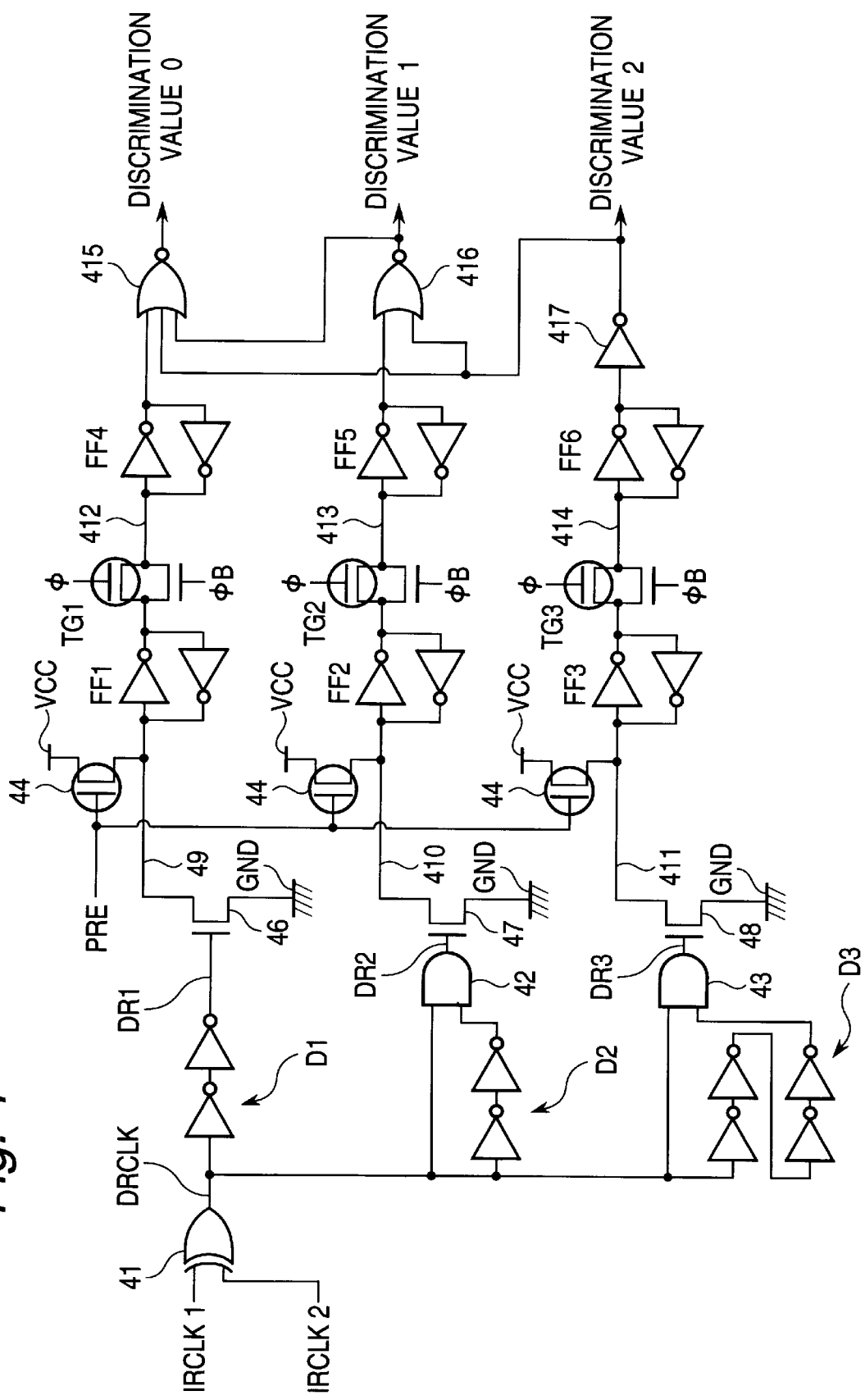
FIG. 4 is a circuit diagram illustrating a specific construction of the difference detecting circuit included in each synchronous DRAM shown in FIGS. 1 and 2.

Referring to FIG. 4, there is shown a circuit diagram illustrating a specific construction of the difference detecting circuit 204.

Figure 6:
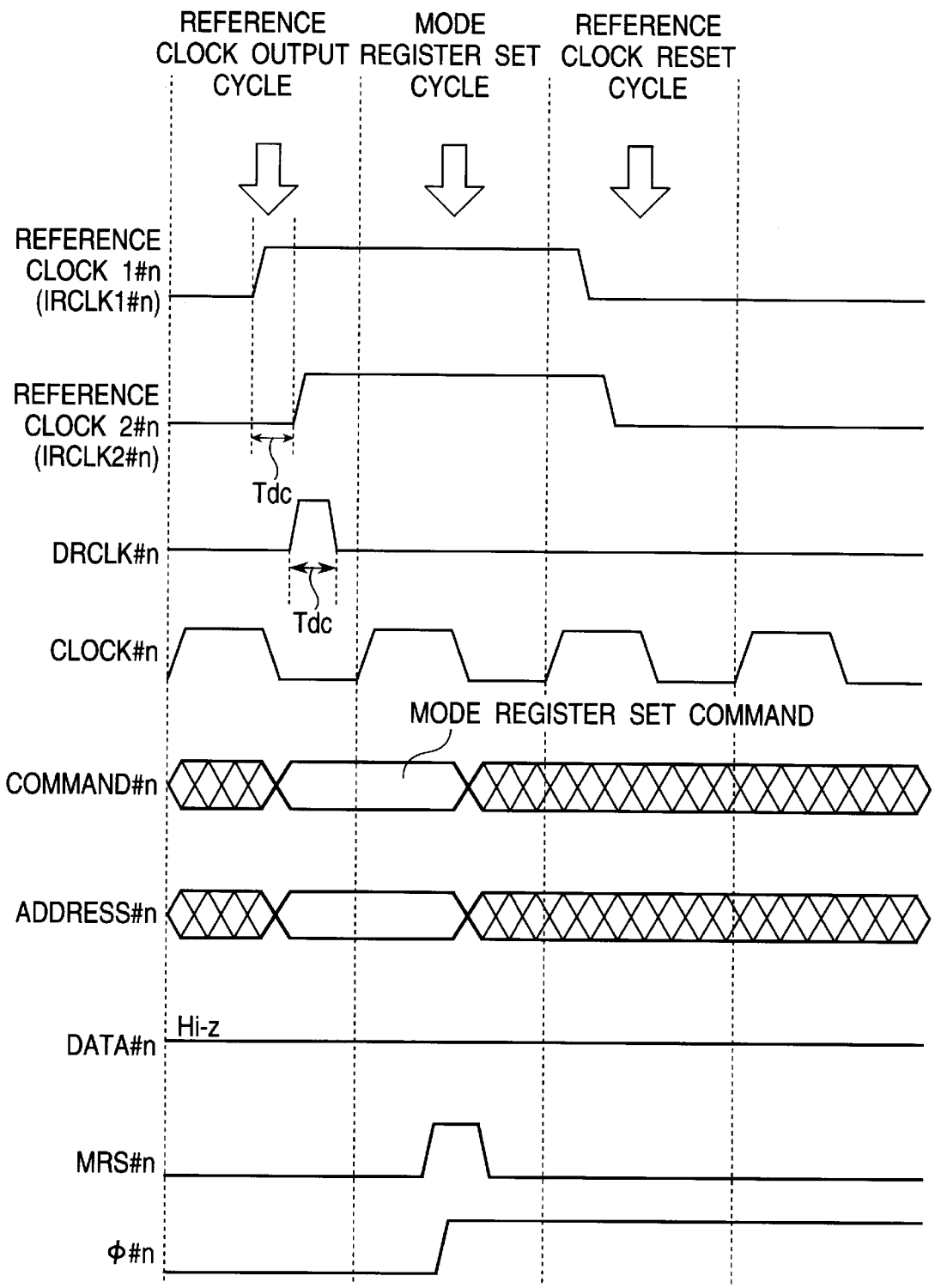
FIG. 6 is a timing chart for illustrating a reference clock latching process in the synchronous DRAM system shown in FIGS. 1 and 2.

Respective outputs IRCLK1 and IRCLK2 outputted from the reference clock receivers 200 and 202 are supplied to an exclusive OR circuit 41, which output a difference clock DRCLK having a high level ("1") width corresponding to a time difference "Tdc" from the moment the output IRCLK1 changes from "0" to "1" to the moment the output IRCLK2 changes from "0" to "1", as shown in FIG. 6.

The difference clock DRCLK is supplied through a delay D1 composed of two cascaded inverters to a gate of a source-grounded N-channel transistor 46. The difference clock DRCLK is also supplied directly to one input of an AND gate 42 and through a delay D2 composed of two cascaded inverters to the other input of the AND gate 42, which has an output connected to a gate of a source-grounded N-channel transistor 47. Furthermore, the difference clock DRCLK is supplied directly to one input of another AND gate 43 and through a delay D3 composed of four cascaded inverters to the other input of the AND gate 3, which has an output connected to a gate of a source-grounded N-channel transistor 48. Here, the number of the cascaded inverters constituting the delay 3 is larger than the number of the cascaded inverters constituting the delay 2.

With this arrangement, if the difference clock DRCLK having the pulse width corresponding to the time difference Tdc is outputted, the transistor 46 is turned on, and if the AND gate 42 outputs a high level "1", the transistor 47 is turned on. Similarly, if the AND gate 43 outputs a high level "1", the transistor 48 is turned on. However, in order for the AND gate 42 to output the high level "1", the time difference Tdc is longer than the delay time of the delay D2 composed of two cascaded inverters. In addition, in order for the AND gate 43 to output the high level "1", the time difference Tdc is longer than the delay time of the delay D3 composed of four cascaded inverters.

A drain of the transistors 46, 47 and 48 are connected to lines 49, 410 and 411, respectively, which are connected to a drain of P-channel transistors 44, respectively, having a source connected in common to a power supply voltage VCC and a gate connected in common to receive a precharge signal. The line 49 is connected through a latch composed of a flipflop FF1, a transfer gate TG1 and another flipflop FF4 to one input of a three-input NOR gate 415. The line 410 is connected through a latch composed of a flipflop MFF, a transfer gate TG2 and another flip fop FF5 to one input of a two-input NOR gate 416. The line 411 is connected through a latch composed of a flipflop FF3, a transfer gate TG3 and another flipflop FF6 to one input of an inverter 417. An output of the NOR gate 416 and an output of the inverter 417 are connected to remaining inputs of the NOR gate 415, and the output of the inverter 417 is also connected to the other input of the NOR gate 416. The NOR gate 415 outputs a signal of the discrimination value 1, and the NOR gate 416 outputs a signal of the discrimination value 2. The inverter 417 outputs a signal of the discrimination value 2.

Here, the condition of the difference detecting circuit 204 shown in FIG. 4 before the reference clocks IRCLK1 and IRCLK2 are inputted will be described. The precharge signal PRE is "0" and the signal lines 49, 410 and 411 are "1", the signal φ is "0", the signal φB is "1", lines 412, 413, 414 are "0", and the discrimination values 0, 1 and 2 are "0". Under this condition, the precharge signal PRE is brought from "0" to "1", so that the P-channel transistors 44 are turned off. Then, the reference clocks IRCLK1 and IRCLK2 are inputted. As a result, at least one of the N-channel transistors 46, 47 and 48 are turned on, and thereafter, the signals φ and φB are brought to "1" and "0", respectively, so that the condition on the signal lines 412, 413 and 413 are latched. In this latched condition, if only the signal 412 in the latched condition is "1", the NOR 415 outputs "1". Namely, the discrimination value 0 becomes "1" (namely, active). For example, if both the signals 412 and 413 in the latched condition are "1", only the output of the NOR 416 is brought to "1", so that the discrimination value 1 becomes "1" (namely, active). Similarly, if all the signals 412, 413 and 414 in the latched condition are "1", only the output of the inverter 417 is brought to "1", so that the discrimination value 2 becomes "1" (namely, active).

FIG. 4 shows only the circuits for the discrimination values 0 to 2, but it would he a matter of course to person skilled in the art that the circuit can be easily increased to output the discrimination values 0 to m.

Figure 5:
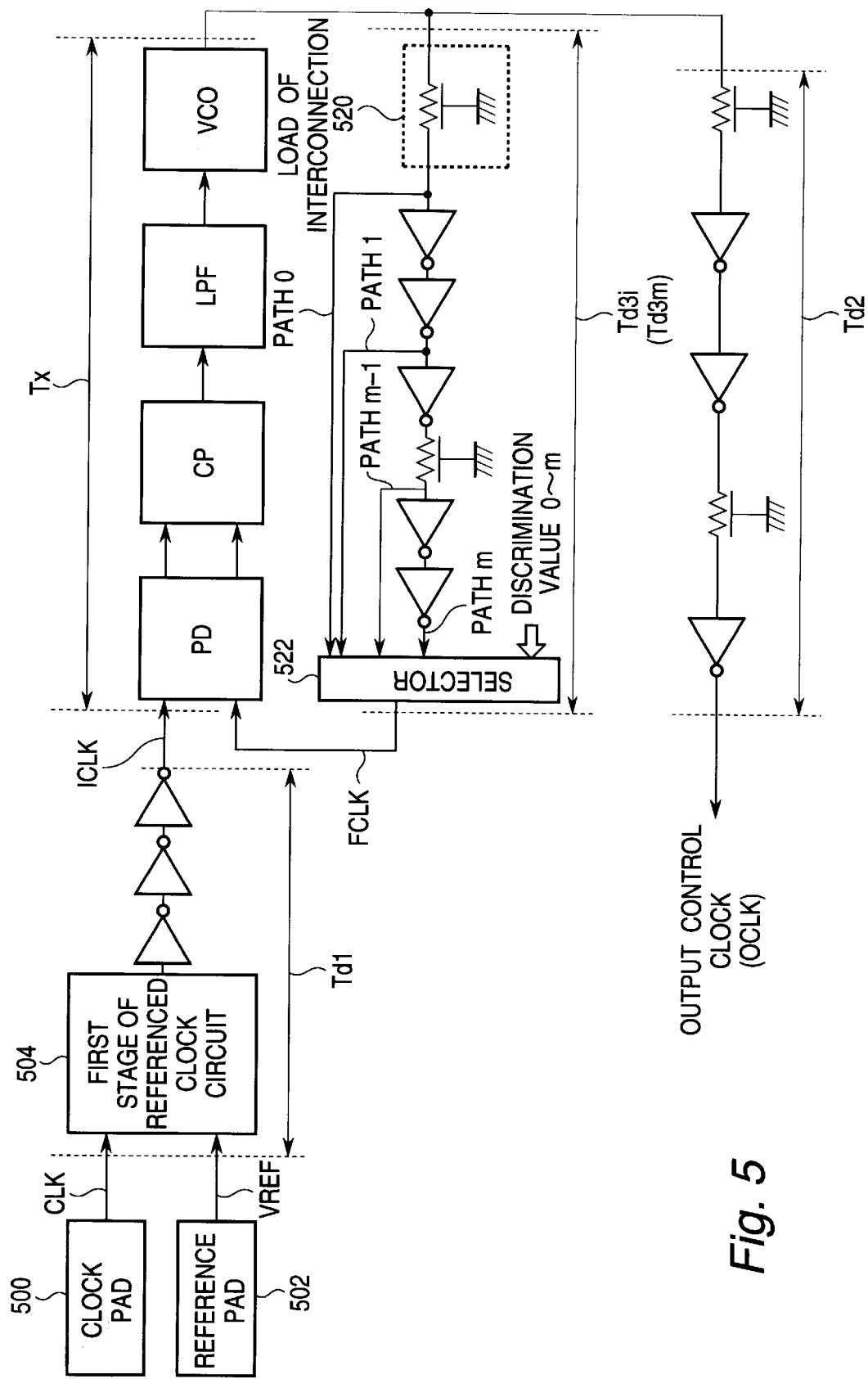
FIG. 5 is a circuit diagram illustrating a specific construction of the output control clock generating circuit included in each synchronous DRAM shown in FIGS. 1 and 2.

FIG. 5 is a circuit diagram illustrating a specific construction of the clock receiver 208 and the output control clock generating circuit 206, which is composed of a well known PLL (phase locked loop) circuit.

In FIG. 5, a clock pad 500 indicates a clock input terminal of each synchronous DRAM M#i, for receiving the clock CLK, and a reference pad 502 designates a terminal for receiving a reference voltage VREF, which is supplied to a first stage 504 of a referenced clock circuit, which constitutes the clock receiver 208. The reference voltage VREF is an intermediate potential between the potential of the low level "0" and the potential of the high level "1", and the first stage 504 of the referenced clock circuit discriminates with reference to the reference voltage VREF, which of "0" and "1" the clock CLK is. As a result, the referenced clock circuit outputs the internal clock ICLK having the same clock period as that of the clock CLK, but a delay time Td1 from the clock CLK.

A PLL circuit constituting the output control clock generating circuit 206 includes a phase detector PD, a charge pump CP, a low pass filter LPF and a voltage controlled oscillator VCO, which are connected in cascade, as well known to persons skilled in the art. An output of the voltage controlled oscillator VCO is supplied through a feedback circuit as a clock FCLK to one input of the phase detector PD having the other input connected to the internal clock ICLK. Thus, the phase detector PD detects a phase difference between the internal clock ICLK and the clock FCLK, and the voltage controlled oscillator VCO controls its output signal so as to make the phase difference to 0 (zero), namely, to make the internal clock ICLK and the clock FCLK equal to each other in phase.

The feedback circuit includes an interconnection load 520 having one end connected to the output of the voltage controlled oscillator VCO, "m+1" delay paths (path 0, path 1, ..., path m−1, path m) connected to the other end of the interconnection load 520, and a (m+1)-input selector 522 having "m+1" inputs connected to the other end of the "m+1" delay paths, respectively, "m+1" control inputs connected to receive the discrimination values 0 to m, respectively, and an output connected to the one input of the phase detector PD. Therefore, this selector 522 can be formed of "m+1" transfer gates having one end connected to the other end of the "m+1" delay paths, respectively, and the other end connected in common to the one input of the phase detector PD, a control input of the "m+1" transfer gates being connected to the discrimination values 0 to m, respectively. Thus, one path is selected from the "m+1" delay paths in accordance with an active discrimination value of the discrimination values 0 to m.

Figure 7:
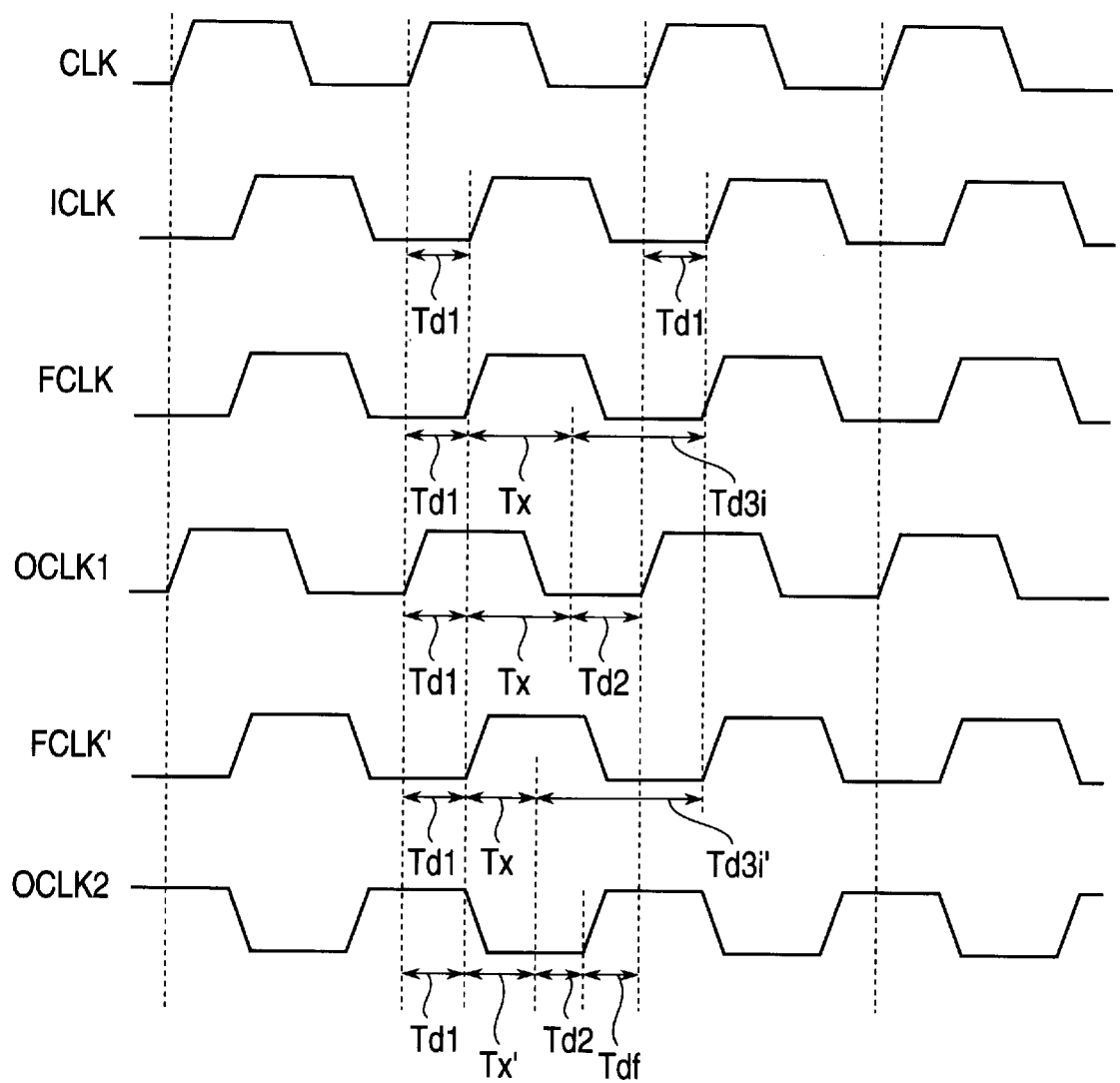
FIG. 7 is a timing chart for illustrating an operation of the output control clock generating circuit.

As mentioned above, the role of the PLL circuit is to make the internal clock ICLK and the clock FCLK equal to each other in phase. Therefore, as shown in FIG. 7, the phase of the clock FCLK is made consistent with the phase of the internal clock ICLK by action of the PLL circuit. In FIG. 5 and FIG. 7, "Td1" indicates the delay time from the moment the clock CLK is inputted to the clock receiver 208 to the moment the internal clock ICLK is outputted from the clock receiver 208. "Tx" designates the delay time from the moment the internal clock ICLK is inputted to the phase detector PD to the moment the output of the voltage controller oscillator VCO is outputted. "Td2" means the delay time required for the signal having passed through a path composed of inverters and an interconnection load.

"Td3i" (where "i"=0 to m) is the delay time from the output of the voltage controller oscillator VCO is outputted to the moment the output of the voltage controller oscillator VCO is inputted to the input of the phase detection PD. Therefore, "Td3i" varies dependently upon which of the path 1 to path m is selected. In the example shown in FIG. 5, this "Td3m" corresponds to the delay time of the signal when the discrimination value m is "1" (active) and therefore when the path m is selected.

Now, an operation of the circuit shown in FIG. 5 will be described with reference to FIG. 7, which is a timing chart for illustrating an operation of the output control clock generating circuit.

After the clock CLK is inputted, the internal clock ICLK is outputted with the delay time Td1. By action of the PLL circuit, the passage time Tx of the signal through the PLL circuit is adjusted to an optimum value, and the phase of the clock FCLK is made consistent with the phase of the internal lock ICLK.

$$(Td1+Tx+Td3i)>(Td1+Tx+Td2) \quad (2)$$

In order to hold the relation expressed by the above equation (2), the output clock OCLK is in advance to the clock FCLK.

$$Td3i=(Td1+Td2) \quad (3)$$

In addition, FIG. 7 illustrates the case that the relation expressed by the above equation (3) holds. In this case, the phase of the clock CLK becomes consistent with the phase of the clock OCLK1.

$$Td3i'=\{(Td1+Td2)+Tdf\} \quad (4)$$

"OCLK2" indicates the case that the relation expressed by the above equation (4) holds. This means that "Td3i" is changed to a long delay time Td3i' in accordance with the active discrimination value, so that the feedback clock having the long delay time Td3i' is outputted from the selector 522 as the clock FCLK. In this case, the output clock OCLK2 is in advance to the clock CLK by the time Tdf.

Here, in order to determine the phase of the clock FCLK, the information of the reference clock has to be captured. Now, a specific setting method will be described with reference to FIG. 6.

The reference clock RCLK is outputted during a reference clock output cycle. As a result, the internal reference clocks IRCLK1#n and IRCLK2#n are generated in the synchronous DRAM M#n, as shown in FIG. 6, and therefore, the difference detecting circuit 204 outputs the clock DRCLK#n having the pulse width Tdc. In a mode register setting cycle next to the reference clock output cycle, the latch pulse φ#n (φ in FIG. 4) is outputted, so that the discrimination value corresponding to the time length Tdc is latched, so that one of the discrimination values 0 to m is activated.

Here, the mode register setting is a command for defining the operation mode of the synchronous DRAM, and determines the burst length and the latency by a combination of addresses. Since the burst and the latency do not have a close relation to the present invention, explanation will be omitted. In a reference clock reset cycle next to the mode register setting cycle, the reference clock is returned to "0".

In FIG. 6, the data #n in a high impedance condition (Hi-z) since no data is supplied, and a signal MRS#n is an internal signal in the synchronous DRAM M#n, for indicating that the mode register setting command is received.

In the above mentioned three cycles, the phase of the clock FCLK is determined in the synchronous DRAM M#n in accordance with the latched discrimination value.

In the above mentioned embodiment, if the synchronous, DRAM M#4 is located at the most remote position from the memory controller MC, the setup time for the memory controller MC to receive the read-out data from the synchronous DRAM M#4 becomes Tsdf#4 as shown in FIG. 3. In other words, the setup time Tsdf#4 can be ensured, differently from the prior art example in which the setup time cannot be ensured.

On the other hand, the hold time Thdf#0 for the memory controller MC to hold the read-out data from the synchronous DRAM M#0 located at the position nearest to the memory controller MC, is ensured because the phase of the output clock OCLK in the synchronous DRAM M#0 is not advanced and therefore because the time Tac#0 is maintained at an optimum value, differently from the prior art example in which if the setup time Tsdf#4 for the synchronous DRAM M#4 located at the most remote position from the memory controller MC, is ensured, the hold time Thdf#0 for the synchronous DRAM M#0 located at the position nearest to the memory controller MC becomes too short.

As seen from the above, in order to have an optimum Tsc#i in any one of the synchronous DRAMs M#0 to M#n, the setup time Tdsf#i and the hold time Tfdf#i for the data #mcfi actually inputted to the memory controller MC is ensured at appropriate values. Therefore, the synchronous DRAM memory system can be operated with no trouble, even if the clock frequency is elevated. Thus, it is possible to speed up the operation of the synchronous DRAM memory system.

The invention has thus been shown and described with reference to the specific embodiments. However, it should be noted that the present invention is in no way limited to the details of the illustrated structures but changes and modifications may be made within the scope of the appended claims.

For example, the specific circuits of the difference detecting circuit 204 and the output control clock generating circuit 206 and the specific method for latching the reference clock have been described. However, the present invention is in no way limited to the specific examples, As seen from the above, the semiconductor memory in accordance with the present invention is characterized in that each of a plurality of memory cell groups (M#i) has first and second terminals for receiving a reference clock (RCLK) supplied from a memory controller (MC), and a signal line for this reference clock (RCLK) is connected from the memory controller (MC) firstly to the first terminal of the most remote memory cell group (M#n), and then, to respective first terminals of the remaining memory cell groups, in order, towards the nearest memory cell group (M#0) and further, to the second terminal of the nearest memory cell group (M#0), and then, to respective second terminals of the remaining memory cell groups, in order, towards the most remote memory cell group (M#n).

With this arrangement, on the basis of the difference in phase between the same reference clock applied to the first and second terminals, each of memory cell groups (M#i) can obtain a delay information of the same memory cell group attributable to the location of the same memory cell group from the memory controller (MC), and therefore, can set an optimum read-out data outputting timing, so that the setup time and the hold time for the read-out data supplied from all the memory cell groups (M#i) can be ensured. Thus, in the semiconductor memory including a plurality of memory cell groups controlled by one memory controller, the reading operation can be speeded up by elevating the clock frequency.

We claim:

1. A semiconductor memory including a plurality of memory cell groups located in the form of an array and a memory controller in common to said plurality of memory cell groups, said memory controller being coupled to each of said plurality of memory cell groups through a clock line, command signal lines, an address bus and a data bus, wherein said memory controller further outputs a reference clock signal to each of said plurality of memory cell groups, wherein each of said plurality of memory cell groups has a first input terminal and a second terminal for receiving said reference clock signal, a first signal line for said reference clock signal being connected from said memory controller, first, to said first terminal of the memory cell group located at the most remote position from said memory controller, and then, respective first terminals of the remaining memory cell groups, in order, towards the memory cell group located at the nearest position to said memory controller, and a second signal for said reference clock signal being connected from said first terminal of the memory cell group located at the nearest position to said memory controller, first, to said second terminal of the memory cell group located at the nearest position to said memory controller, and then, respective second terminals of the remaining memory cell groups, in order, towards the memory cell group located at the most remote position from said memory controller.

2. A semiconductor memory claimed in claim 1 wherein said memory controller includes a clock driver for outputting an clock signal, and each of said memory cell groups includes a clock receiver receiving said clock signal for outputting an internal clock signal, so that the operation of said memory controller and the operation of said memory cell groups are synchronized to each other.

3. A semiconductor memory claimed in claim 2 wherein each of said memory cell groups includes a difference detecting circuit for detecting a time difference between said reference clock applied to said first terminal and said reference clock applied to said second terminal, so that an output timing of a read-out data is adjusted on the basis of said time difference.

4. A semiconductor memory claimed in claim 3 wherein said difference detecting circuit outputs said time difference by selectively activating one of a predetermined number of discrimination values.

5. A semiconductor memory claimed in claim 4 wherein each of said memory cell groups further includes an output control clock generating circuit receiving said internal clock signal and said discrimination values for outputting an output clock which has the same frequency as that of said internal clock, so that the read-out data is outputted from the memory cell group in accordance with said output clock.

6. A semiconductor memory claimed in claim 5 wherein said output control clock outputs said output clock which has the phase adjusted in comparison with the phase of said clock signal outputted from said clock driver of said memory controller, in accordance with the activated discrimination value of said discrimination values, so that the read-out data is outputted from the memory cell group in accordance with said output clock.

* * * * *